(12) United States Patent
Kirkpatrick et al.

(10) Patent No.: US 11,522,518 B2
(45) Date of Patent: Dec. 6, 2022

(54) DEVICE HAVING A TITANIUM-ALLOYED SURFACE

(71) Applicant: Qorvo US, Inc., Greensboro, NC (US)

(72) Inventors: Casey Kirkpatrick, Jamestown, NC (US); Andrew P. Ritenour, Colfax, NC (US)

(73) Assignee: Qorvo US, Inc., Greensboro, NC (US)

( * ) Notice: Subject to any disclaimer, the term of this patent is extended or adjusted under 35 U.S.C. 154(b) by 367 days.

(21) Appl. No.: 16/722,125

(22) Filed: Dec. 20, 2019

(65) Prior Publication Data

US 2020/0127641 A1 Apr. 23, 2020

Related U.S. Application Data

(62) Division of application No. 15/644,922, filed on Jul. 10, 2017, now Pat. No. 10,581,403.
(Continued)

(51) Int. Cl.
*H03H 9/25* (2006.01)
*H03H 3/08* (2006.01)
*H01L 41/332* (2013.01)
*H03H 9/145* (2006.01)
*H01L 41/187* (2006.01)
(Continued)

(52) U.S. Cl.
CPC ........... *H03H 9/25* (2013.01); *H01L 41/0477* (2013.01); *H01L 41/1873* (2013.01); *H01L 41/29* (2013.01); *H01L 41/332* (2013.01); *H03H 3/08* (2013.01); *H03H 9/14541* (2013.01); *H03H 9/64* (2013.01)

(58) Field of Classification Search
CPC .............................. H03H 9/25; H03H 9/14541
See application file for complete search history.

(56) References Cited

U.S. PATENT DOCUMENTS

| 3,731,230 A | 5/1973 | Cerny, Jr. |
| 3,875,533 A | 4/1975 | Irwin et al. |

(Continued)

FOREIGN PATENT DOCUMENTS

| CN | 111917392 A | 11/2020 |
| JP | 2002251190 A | 9/2002 |

(Continued)

OTHER PUBLICATIONS

Aigner, R. et al., "3G—4G—5G: How BAW Filter Technology Enables a Connected World," 20th International Conference on Solid-State Sensors, Actuators and Microsystems & Eurosensors XXXIII (Transducers & Eurosensors XXXIII), Jun. 23-27, 2019, Berlin, Germany, IEEE, pp. 523-526.

(Continued)

*Primary Examiner* — John A Bodnar
(74) *Attorney, Agent, or Firm* — Withrow & Terranova, P.L.L.C.

(57) ABSTRACT

Disclosed is a device that includes a crystalline substrate and a patterned aluminum-based material layer disposed onto the crystalline substrate. The patterned aluminum-based material layer has a titanium-alloyed surface. A titanium-based material layer is disposed over select portions of the titanium-alloyed surface. In an exemplary embodiment, the patterned aluminum-based material layer forms a pair of interdigitated transducers to provide a surface wave acoustic (SAW) device. The SAW device of the present disclosure is usable to realize SAW-based filters for wireless communication equipment.

4 Claims, 4 Drawing Sheets

Related U.S. Application Data

(60) Provisional application No. 62/360,558, filed on Jul. 11, 2016.

(51) Int. Cl.
  *H01L 41/29* (2013.01)
  *H01L 41/047* (2006.01)
  *H03H 9/64* (2006.01)

(56) References Cited

U.S. PATENT DOCUMENTS

| | | | |
|---|---|---|---|
| 4,442,434 A | 4/1984 | Baekgaard |
| 4,577,168 A | 3/1986 | Hartmann |
| 5,291,159 A | 3/1994 | Vale |
| 5,821,833 A | 10/1998 | Lakin |
| 6,067,391 A | 5/2000 | Land |
| 6,670,866 B2 | 12/2003 | Ellaet et al. |
| 6,714,099 B2 | 3/2004 | Hikita et al. |
| 6,720,844 B1 | 4/2004 | Lakin |
| 6,927,649 B2 | 8/2005 | Metzger et al. |
| 6,927,651 B2 | 8/2005 | Larson, III et al. |
| 6,975,183 B2 | 12/2005 | Aigner et al. |
| 7,057,478 B2 | 6/2006 | Korden et al. |
| 7,173,504 B2 | 2/2007 | Larson, III et al. |
| 7,239,067 B2 | 7/2007 | Komuro et al. |
| 7,321,183 B2 | 1/2008 | Ebuchi et al. |
| 7,342,351 B2 | 3/2008 | Kubo et al. |
| 7,367,095 B2 | 5/2008 | Larson, III et al. |
| 7,391,285 B2 | 6/2008 | Larson, III et al. |
| 7,436,269 B2 | 10/2008 | Wang et al. |
| 7,515,018 B2 | 4/2009 | Handtmann et al. |
| 7,804,374 B1 | 9/2010 | Brown et al. |
| 7,825,749 B2 | 11/2010 | Thalhammer et al. |
| 7,855,618 B2 | 12/2010 | Frank et al. |
| 7,889,024 B2 | 2/2011 | Bradley et al. |
| 7,898,493 B1 | 3/2011 | Rojas et al. |
| 7,956,705 B2 | 6/2011 | Meister et al. |
| 7,973,620 B2 | 7/2011 | Shirakawa et al. |
| 8,248,185 B2 | 8/2012 | Choy et al. |
| 8,508,315 B2 | 8/2013 | Jamneala et al. |
| 8,575,820 B2 | 11/2013 | Shirakawa et al. |
| 8,576,024 B2 | 11/2013 | Erb et al. |
| 8,923,794 B2 | 12/2014 | Aigner |
| 8,981,627 B2 | 3/2015 | Sakuma et al. |
| 8,991,022 B2 | 3/2015 | Satoh et al. |
| 9,054,671 B2 | 6/2015 | Adkisson et al. |
| 9,054,674 B2 | 6/2015 | Inoue et al. |
| 9,197,189 B2 | 11/2015 | Miyake |
| 9,243,316 B2 | 1/2016 | Larson, III et al. |
| 9,484,883 B2 | 11/2016 | Nishizawa et al. |
| 9,698,756 B2 | 7/2017 | Khlat et al. |
| 9,837,984 B2 | 12/2017 | Khlat et al. |
| 9,847,769 B2 | 12/2017 | Khlat et al. |
| 9,887,686 B2 | 2/2018 | Kuwahara |
| 9,929,716 B2 | 3/2018 | Lee et al. |
| 10,009,001 B2 | 6/2018 | Jiang et al. |
| 10,141,644 B2 | 11/2018 | Khlat et al. |
| 2002/0109564 A1 | 8/2002 | Tsai et al. |
| 2004/0100342 A1 | 5/2004 | Nishihara et al. |
| 2004/0263286 A1 | 12/2004 | Unterberger |
| 2005/0057117 A1 | 3/2005 | Nakatsuka et al. |
| 2005/0093648 A1 | 5/2005 | Inoue |
| 2005/0206476 A1 | 9/2005 | Ella et al. |
| 2006/0091978 A1 | 5/2006 | Wang et al. |
| 2008/0007369 A1 | 1/2008 | Barber et al. |
| 2008/0169884 A1 | 7/2008 | Matsumoto et al. |
| 2008/0272853 A1 | 11/2008 | Heinze et al. |
| 2008/0297278 A1 | 12/2008 | Handtmann et al. |
| 2009/0096549 A1 | 4/2009 | Thalhammer et al. |
| 2009/0096550 A1 | 4/2009 | Handtmann et al. |
| 2010/0277237 A1 | 11/2010 | Sinha et al. |
| 2011/0115334 A1 | 5/2011 | Konishi et al. |
| 2011/0121689 A1 | 5/2011 | Grannen et al. |
| 2011/0204995 A1 | 8/2011 | Jamneala et al. |
| 2011/0210787 A1 | 9/2011 | Lee et al. |
| 2012/0007696 A1 | 1/2012 | Pang et al. |
| 2012/0187799 A1 | 7/2012 | Nakahashi |
| 2012/0313725 A1 | 12/2012 | Ueda et al. |
| 2013/0033150 A1 | 2/2013 | Bardong et al. |
| 2013/0113576 A1 | 5/2013 | Inoue et al. |
| 2013/0193808 A1 | 8/2013 | Feng et al. |
| 2014/0085020 A1 | 3/2014 | Reinhardt et al. |
| 2014/0125203 A1 | 5/2014 | Choy et al. |
| 2014/0132117 A1 | 5/2014 | Larson, III |
| 2014/0145557 A1 | 5/2014 | Tanaka |
| 2014/0167565 A1 | 6/2014 | Iwamoto |
| 2015/0054387 A1 | 2/2015 | Li |
| 2015/0222246 A1 | 8/2015 | Nosaka |
| 2015/0280100 A1 | 10/2015 | Burak et al. |
| 2015/0369153 A1 | 12/2015 | Tsunooka et al. |
| 2016/0028364 A1 | 1/2016 | Takeuchi |
| 2016/0056789 A1 | 2/2016 | Otsubo et al. |
| 2016/0191012 A1 | 6/2016 | Khlat et al. |
| 2016/0191014 A1 | 6/2016 | Khlat et al. |
| 2016/0191016 A1 | 6/2016 | Khlat et al. |
| 2016/0261235 A1 | 9/2016 | Ortiz |
| 2016/0268998 A1 | 9/2016 | Xu et al. |
| 2016/0308576 A1 | 10/2016 | Khlat et al. |
| 2016/0359468 A1 | 12/2016 | Taniguchi et al. |
| 2017/0093369 A1 | 3/2017 | Khlat et al. |
| 2017/0093370 A1 | 3/2017 | Khlat et al. |
| 2017/0141757 A1 | 5/2017 | Schmidhammer |
| 2017/0201233 A1 | 7/2017 | Khlat |
| 2017/0301992 A1 | 10/2017 | Khlat et al. |
| 2017/0310302 A1 | 10/2017 | Bauder et al. |
| 2017/0324159 A1 | 11/2017 | Khlat |
| 2017/0338795 A1 | 11/2017 | Nakagawa et al. |
| 2018/0013402 A1 | 1/2018 | Kirkpatrick et al. |
| 2018/0041191 A1 | 2/2018 | Park |
| 2018/0076793 A1 | 3/2018 | Khlat et al. |
| 2018/0076794 A1 | 3/2018 | Khlat et al. |
| 2018/0109236 A1 | 4/2018 | Konoma |
| 2018/0109237 A1 | 4/2018 | Wasilik et al. |
| 2018/0145658 A1 | 5/2018 | Saji |
| 2018/0219530 A1 | 8/2018 | Khlat et al. |
| 2018/0241418 A1 | 8/2018 | Takamine et al. |
| 2019/0140618 A1 | 5/2019 | Takamine |
| 2019/0181824 A1 | 6/2019 | Timme et al. |
| 2019/0181835 A1 | 6/2019 | Timme et al. |
| 2019/0199320 A1 | 6/2019 | Morita et al. |
| 2019/0207583 A1 | 7/2019 | Miura et al. |
| 2019/0222197 A1 | 9/2019 | Saji |
| 2019/0288664 A1 | 9/2019 | Saji |
| 2019/0305752 A1 | 10/2019 | Sadhu et al. |
| 2022/0069800 A1 | 3/2022 | Han et al. |

FOREIGN PATENT DOCUMENTS

| | | |
|---|---|---|
| JP | 2008085989 A | 4/2008 |
| JP | 2011176744 A | 9/2011 |
| JP | 2012257050 A | 12/2012 |
| JP | 2017103654 A | 6/2017 |
| JP | 2018093388 A | 6/2018 |

OTHER PUBLICATIONS

Kreuzer, S. et al., "Full band 41 filter with high Wi-Fi rejection—design and manufacturing challenges," IEEE International Ultrasonics Symposium (IUS), Oct. 21-24, 2015, Taipei, Taiwan, IEEE, 4 pages.

Volatier, A. et al., "Technology enhancements for high performance BAW duplexer," IEEE International Ultrasonics Symposium (IUS), Jul. 21-25, 2013, Prague, Czech Republic, IEEE, pp. 761-764.

Non-Final Office Action for U.S. Appl. No. 16/358,823, dated Apr. 5, 2021, 12 pages.

Non-Final Office Action for U.S. Appl. No. 15/883,933, dated Mar. 29, 2021, 11 pages.

Non-Final Office Action for U.S. Appl. No. 16/740,667, dated Mar. 4, 2021, 10 pages.

Non-Final Office Action for U.S. Patent Application No. 16/776,738, dated Mar. 4, 2021, 7 pages.

(56) References Cited

OTHER PUBLICATIONS

Non-Final Office Action for U.S. Appl. No. 16/806,166, dated Mar. 18, 2021, 6 pages.
Notice of Allowance for U.S. Appl. No. 16/290,175, dated Jun. 14, 2021, 7 pages.
Corrected Notice of Allowability for U.S. Appl. No. 16/290,175, dated Jun. 23, 2021, 4 pages.
Notice of Allowance for U.S. Appl. No. 16/740,667, dated Jun. 11, 2021, 7 pages.
Notice of Allowance for U.S. Appl. No. 16/776,738, dated Jun. 11, 2021, 7 pages.
Notice of Allowance for U.S. Appl. No. 16/806,166, dated Jun. 18, 2021, 7 pages.
Non-Final Office Action for U.S. Appl. No. 16/283,044, dated Nov. 12, 2020, 9 pages.
Notice of Allowance for U.S. Appl. No. 15/697,658, dated Nov. 17, 2020, 7 pages.
Advisory Action for U.S. Appl. No. 15/883,933, dated Dec. 31, 2020, 3 pages.
Non-Final Office Action for U.S. Appl. No. 16/290,175, dated Jan. 6, 2021, 14 pages.
Capilla, Jose et al., "High-Acoustic-Impedence Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.
Fattinger, Gernot et al., ""Single-to-balanced Filters for Mobile Phones using Coupled Resonator BAW Technology,"" 2004 IEEE International Ultrasonics, Ferroelectrics,and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/290,175, dated Apr. 14, 2020, 29 pages.
Ibrahim, A. et al., "Compact Size Microstrip Coupled Resonator Band Pass Filter Loaded with Lumped Capacitors," 2013 Second International Japan-Egypt Conference on Electronics, Communications and Computers (JEC-ECC), Dec. 17-19, 2013, Egypt, IEEE, 4 pages.
Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.
Zhu, L. et al., "Adjustable Bandwidth Filter Design Based on Interdigital Capacitors," IEEE Microwave and Wireless Components Letters, vol. 18, No. 1, Jan. 2008, IEEE, pp. 16-18.
Notice of Allowance and Examiner-Initiated Interview Summary for U.S. Appl. No. 16/003,417, dated Aug. 5, 2020, 9 pages.
Final Office Action for U.S. Appl. No. 16/290,175, dated Sep. 17, 2020, 13 pages.
Final Office Action for U.S. Appl. No. 15/883,933, dated Oct. 23, 2020, 15 pages.
Non-Final Office Action for U.S. Appl. No. 14/757,587, dated Sep. 13, 2016, 12 pages.
Notice of Allowance for U.S. Appl. No. 14/757,587, dated Mar. 9, 2017, 8 pages.
Non-Final Office Action for U.S. Appl. No. 15/004,084, dated Jun. 12, 2017, 9 pages.
Non-Final Office Action for U.S. Appl. No. 14/757,651, dated Jun. 9, 2017, 11 pages.
Non-Final Office Action for U.S. Appl. No. 15/275,957, dated Jun. 14, 2017, 9 pages.
Ex Parte Quayle Action for U.S. Appl. No. 15/347,452, dated Jun. 15, 2017, 7 pages.
Final Office Action for U.S. Appl. No. 15/275,957, dated Jan. 2, 2018, 7 pages.

Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Dorrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Non-Final Office Action for U.S. Appl. No. 15/697,658, dated May 1, 2019, 13 pages.
Larson, John, et al., "Characterization of Reversed c-axis AlN Thin Films," International Ultrasonics Symposium Proceedings, 2010, IEEE, pp. 1054-1059.
Notice of Allowance for U.S. Appl. No. 15/586,374, dated Oct. 4, 2019, 7 pages.
Notice of Allowance for U.S. Appl. No. 15/644,922, dated Oct. 21, 2019, 10 pages.
Final Office Action for U.S. Appl. No. 15/697,658, dated Oct. 22, 2019, 9 pages.
Non-Final Office Action for U.S. Appl. No. 15/883,933, dated Oct. 25, 2019, 19 pages.

(56) References Cited

OTHER PUBLICATIONS

Non-Final Office Action for U.S. Appl. No. 16/003,417, dated Apr. 3, 2020, 9 pages.
Moreira, M. et al., "Aluminum scandium nitride thin-film bulk acoustic resonators for wide band applications," Vacuum, vol. 86, Issue 1, Jul. 2011, Elsevier Ltd., 4 pages.
Non-Final Office Action for U.S. Appl. No. 17/152,110, dated May 27, 2022, 6 pages.
Extended European Search Report for European Patent Application No. 22150239.6, dated Jun. 9, 2022, 10 pages.
Non-Final Office Action for U.S. Appl. No. 17/088,872, dated Aug. 29, 2022, 8 pages.
Office Action for Japanese Patent Application No. 2018181230, dated Sep. 14, 2022, 9 pages.
Notice of Allowance for U.S. Appl. No. 17/152,110, daed Sep. 21, 2022, 7 pages.

DEVICE HAVING A TITANIUM-ALLOYED SURFACE

RELATED APPLICATIONS

This application is a divisional of U.S. patent application Ser. No. 15/644,922, filed Jul. 10, 2017, which claims the benefit of provisional patent application Ser. No. 62/360,558, filed Jul. 11, 2016, the disclosures of which are hereby incorporated herein by reference in their entireties.

FIELD OF THE DISCLOSURE

The present disclosure is directed to improving performance characteristics of acoustic wave devices.

BACKGROUND

In acoustic wave device technology a first metal layer is a patterned aluminum-based material layer known as an interdigital transducer (IDT) metal layer. Typically, an IDT metal layer comprises aluminum (Al) and a relatively smaller amount of titanium (Ti). The aluminum dominates the composition of the IDT metal layer because it has a higher ratio of conductivity to mass than titanium. The conductivity-to-mass ratio is a relatively critical characteristic for acoustic wave devices because a higher conductivity-to-mass ratio yields a lower insertion loss for radio frequency filters constructed from acoustic wave devices.

While aluminum is a desirable component of IDT metal, aluminum is not ideal because aluminum oxidizes readily when exposed to oxygen in air to form aluminum oxide. However, the oxidation of aluminum is typically self-limiting such that the formation of the oxide layer prevents additional oxidation of the aluminum metal making up the IDT metal layer. The oxide layer becomes detrimental at locations on the acoustic wave device where it is necessary to connect additional metal layers to the IDT metal layer.

In lithium tantalate surface acoustic wave (LTSAW) technology used to make a subset of acoustic wave devices, a second metal layer most often in contact with the IDT metal layer is an under bump metallurgy (UBM) metal. This second metal layer is deposited to form appropriate circuit connections for the acoustic wave device and is composed of Ti/Al/Ti. However, an aluminum oxide (AlO) layer formed on the IDT layer is insulating and is chemically and physically robust such that etching vias to connect the UBM to the IDT metal layer is not effective at removing the AlO layer. In addition to the robustness of the AlO layer, LTSAW process flow requires exposure of the aluminum IDT metal layer to ambient air during operations prior to UBM evaporation, which allows for re-oxidation of aluminum in any areas exposed by removal of the AlO during processing. The insulating nature of the AlO layer prevents consistent, low direct current (DC) contact resistance between UBM and the IDT metal layer. This AlO insulating layer also increases insertion loss by limiting conductivity between UBM and IDT layers. The lack of DC contact makes process control monitoring difficult because most process control monitoring is performed by DC measurement of test structures. The AlO between the UBM and the IDT metal layer also adds additional capacitance to radio frequency test structures, which can complicate parameter extraction and modeling. In addition to negative effects on electrical characteristics of acoustic devices, the AlO layer can also affect the mechanical properties of acoustic devices. The AlO layer prevents metal-to-metal contact between the IDT metal layer and the UBM. Therefore, adhesion between the IDT metal layer and the UBM is reduced. This reduction in adhesion reduces shear strength between the IDT metal layer and the UBM. As such, the robustness of acoustic devices during assembly is reduced by mechanical stresses of assembly. Thus, there is a need for acoustic devices that do not have AlO layers formed between the UBM and IDT layers.

SUMMARY

Disclosed is a device that includes a crystalline substrate and a patterned aluminum-based material layer disposed onto the crystalline substrate. The patterned aluminum-based material layer has a titanium-alloyed surface. A titanium-based material layer is disposed over select portions of the titanium-alloyed surface.

In an exemplary embodiment, the patterned aluminum-based material layer forms a pair of interdigitated transducers to provide a surface acoustic wave (SAW) device. The SAW device of the present disclosure is usable to realize SAW-based filters for wireless communication equipment.

Another aspect of the disclosure provides a method of fabricating the device. In general, the method includes a process step of disposing a patterned aluminum-based material layer onto a crystalline substrate. Another process step includes disposing a titanium-based material layer over the patterned aluminum-based material layer. Yet another process step includes selectively etching away portions of the titanium based material layer to leave an exposed titanium-alloyed surface on the portions of the patterned aluminum-based material layer.

In at least one exemplary embodiment another step includes disposing an under bump metallurgy layer comprising a metal directly in contact with the portions of the titanium-alloyed surface. The resulting contact resistivity is in the range of $1 \times 10^{-8}$ ohm $(\Omega)/cm^2$ and $1 \times 10^{-7}$ $\Omega/cm^2$.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
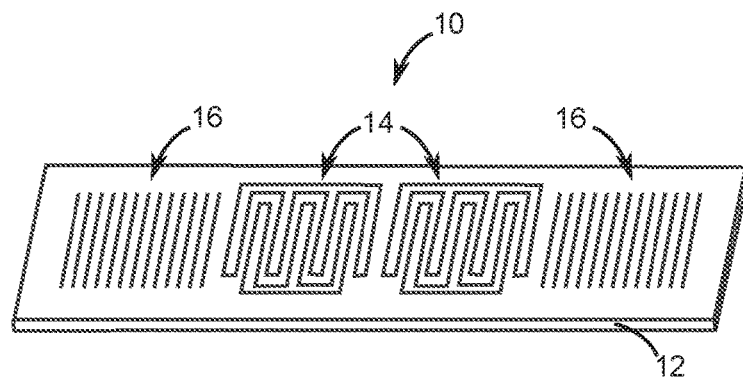
FIG. 1 is a perspective drawing of an acoustic device of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a perspective drawing of the acoustic wave device 10 of the present disclosure. The acoustic wave device 10 includes a crystalline substrate 12, such as lithium tantalate ($LiTaO_3$) or lithium niobate ($LiNbO_3$), onto which an interdigital transducer layer that is a patterned aluminum-based material layer 14 is disposed. In the exemplary embodiment of FIG. 1, the patterned aluminum-based material layer 14 has a pattern of interdigitated fingers. Additional elements such as acoustic reflectors 16 are included on acoustic devices such as surface acoustic wave (SAW) resonators. An exemplary acoustic wave device 10 is depicted as a SAW resonator that is typically coupled with other SAW resonators to form SAW filters that are used in wireless products such as smart phones.

Figure 2:
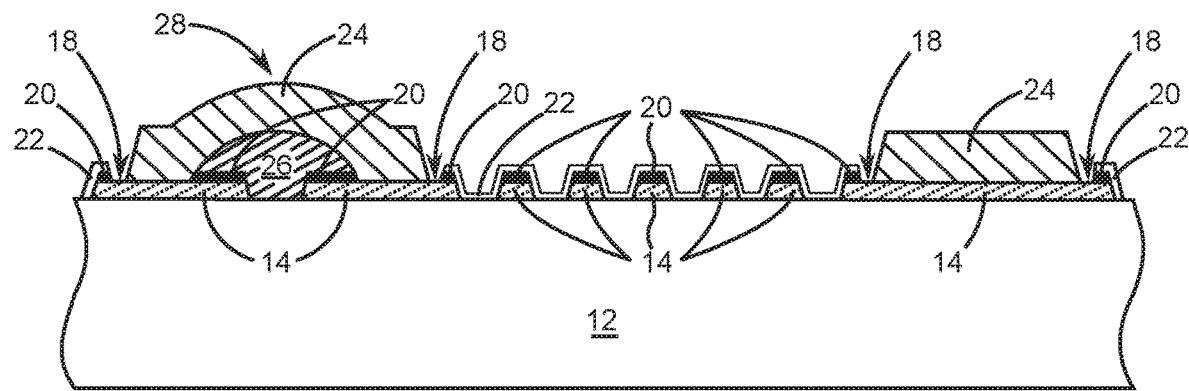
FIG. 2 is a cross-sectional view of a completed portion of one embodiment of the acoustic device of the FIG. 1.

FIG. 2 is a cross-sectional view of a completed portion of one embodiment of the acoustic wave device 10. As in FIG. 1, the patterned aluminum-based material layer 14 is disposed onto the crystalline substrate 12. In at least one embodiment the patterned aluminum-based material layer 14 is at least 99% aluminum. In other embodiments, the patterned aluminum-based material layer 14 is an aluminum alloy. In some embodiments, the aluminum alloy is an aluminum/copper alloy.

In addition, the patterned aluminum-based material layer 14 has a titanium-alloyed surface 18 that is formed during fabrication of the acoustic wave device 10 as portions of a titanium-based material layer 20 are etched away. The remaining portions of the titanium-based material layer 20 are protected from etching by a photoresist during subsequent processing.

The titanium-based material layer 20 is disposed between 10% and 90% of the titanium-alloyed surface 18. In yet other embodiments, the titanium-based material layer 20 is disposed between 10% and 75% of the titanium-alloyed surface 18. In yet other embodiments, the titanium-based material layer 20 is disposed between 10% and 50% of the titanium-alloyed surface 18. In at least one embodiment, the titanium-based material layer 20 is 99% titanium. In other embodiments, the titanium-based material layer 20 is a titanium alloy. In at least some embodiments, the titanium alloy making up the titanium-based material layer 20 is titanium/aluminum.

In some embodiments, the titanium-based material layer 20 has a thickness that is in the range of 20 angstroms (Å) to 50 Å. In other embodiments, the titanium-based material layer 20 has a thickness that is in the range of 50 Å to 70 Å. In yet other embodiments, the titanium-based material layer 20 has a thickness that is in the range of 70 Å to 100 Å. In still yet other embodiments, the titanium-based material layer 20 has a thickness that is in the range of 100 Å to 500 Å.

An under bump metallurgy (UBM) layer 24 is made up of a metal disposed directly onto portions of the titanium-alloyed surface 18 of the patterned aluminum-based material layer 14 not covered by the titanium-based material layer 20. In some locations a crossover pattern 26 provides support for a bridging portion 28 of the UBM layer 24. Contact resistivity between the metal of the UBM layer 24 and the titanium-alloyed surface is in the range of $1 \times 10^{-8}$ and $1 \times 10^{-7}$ ohm $(\Omega)/cm^2$.

Figure 3:
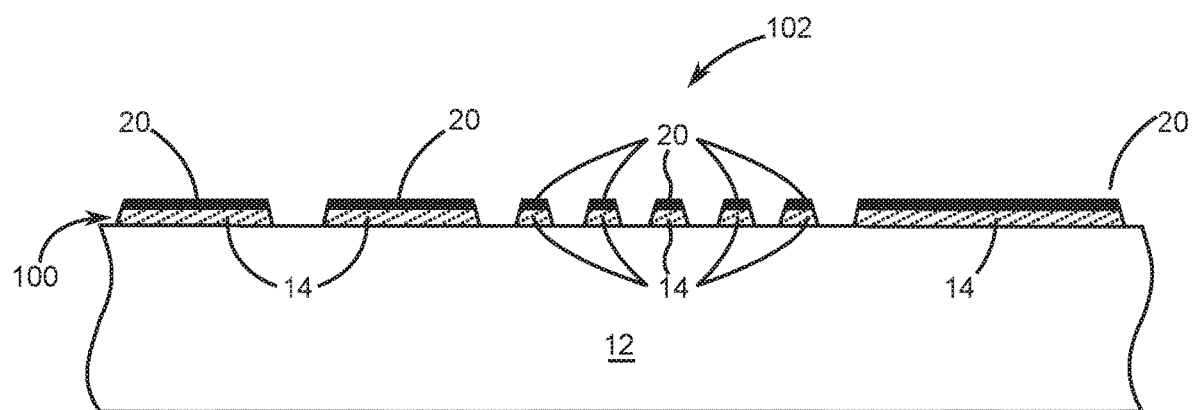
FIG. 3 is a cross-sectional view of a result of beginning steps completed for fabricating the portion of the embodiment of the acoustic device depicted in FIG. 2.

FIG. 3 is a cross-sectional view of a result of beginning steps completed for fabricating the portion of the embodiment of the acoustic wave device 10 depicted in FIG. 2. A first step is disposing the patterned aluminum-based material layer 14 onto the crystalline substrate 12 (step 100). A next step is disposing the titanium-based material layer 20 directly onto the patterned aluminum-based material layer 14 (step 102). The thickness of the titanium-based material layer 20 is controlled throughout the deposition step such that the titanium-based material layer 20 has an ultimate thickness that is selectively in the range of 20 Å to 500 Å.

Figure 4:
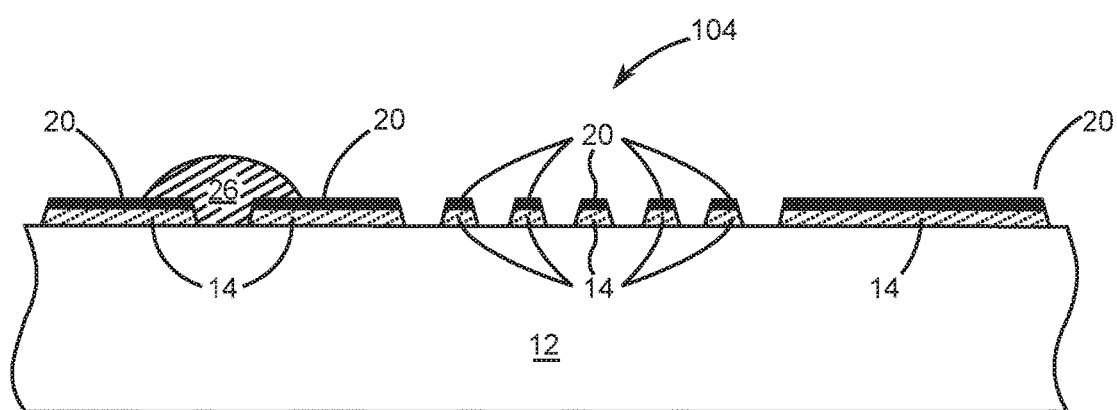
FIG. 4 is a cross-sectional view of a result of a step that involves disposing a crossover pattern that will in later steps provide support for a bridging portion of an under bump metallurgy (UBM) layer.

FIG. 4 is a cross-sectional view of a result of a next step that involves disposing the crossover pattern 26 that in later steps provides support for the bridging portion 28 of the UBM layer 24 (step 104). In an exemplary embodiment, the crossover pattern is made of photo definable polymer. Other suitable materials for the crossover pattern include, but are not limited to, silicon oxide, silicon oxynitride, and other dielectrics with a permeability below 5.

Figure 5:
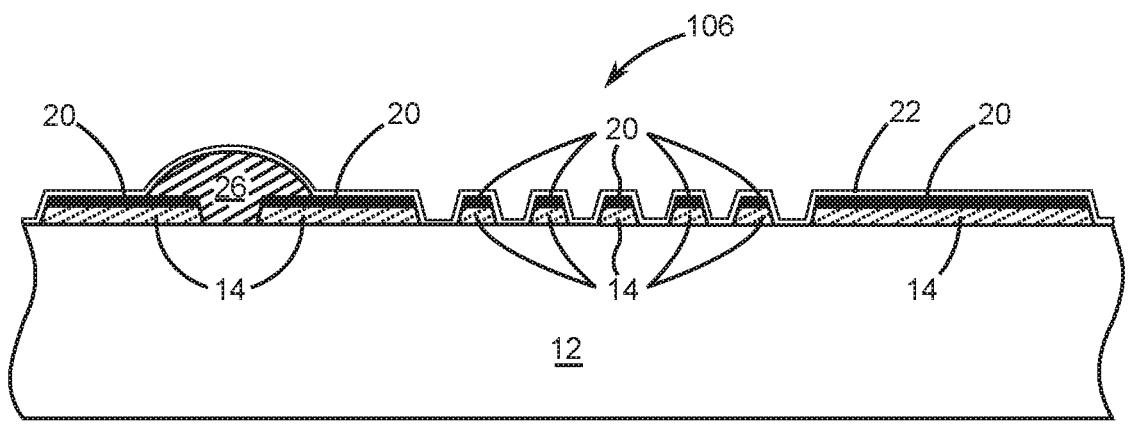
FIG. 5 is a cross-sectional view of a result of another step that involves disposing the passivation layer onto the titanium-based material layer, the crossover pattern, and exposed sections of the substrate.

FIG. 5 is a cross-sectional view of a result of another step that involves disposing the passivation layer 22 onto the titanium-based material layer 20, the crossover pattern 26, and exposed sections of the crystalline substrate 12 (step 106). In some embodiments, the passivation layer 22 is made of $SiO_2$ and in other embodiments the passivation layer is made of SiN or a bilayer of $SiO_2$ and SiN.

Figure 6:
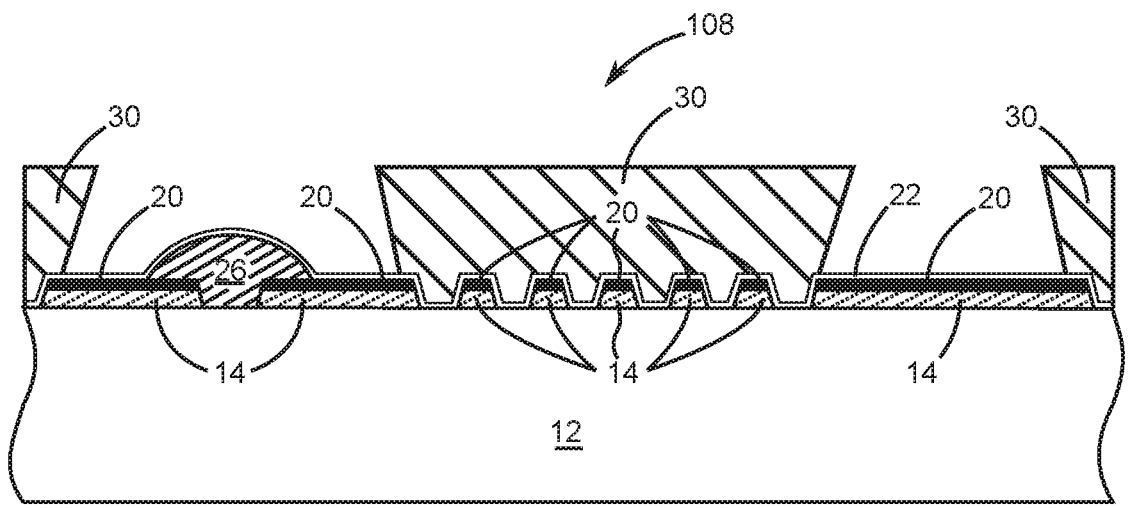
FIG. 6 is a cross-sectional view of a result of another step that involves disposing a photoresist mask over portions of the patterned aluminum-based material layer and titanium-based material layer.

FIG. 6 is a cross-sectional view of a result of another step that involves disposing a photoresist mask 30 over portions of the patterned aluminum-based material layer 14 and titanium-based material layer 20 (step 108). The photoresist mask 30 defines interconnect metal regions that are occupied by the UBM layer 24 in subsequent steps.

Figure 7:
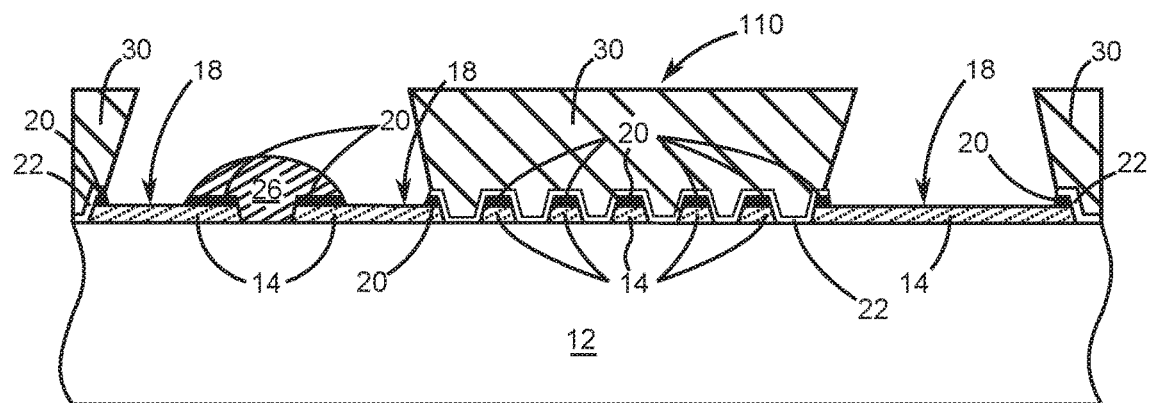
FIG. 7 is a cross-sectional view of a result of another step that involves etching away portions of the passivation layer and titanium-based material layer to leave regions of the titanium-alloyed surface exposed.

FIG. 7 is a cross-sectional view of a result of another step that involves etching away portions of the passivation layer 22 and the titanium-based material layer 20 to leave regions of the titanium-alloyed surface 18 exposed (step 110). The passivation layer 22 is also etched from the crossover pattern 26 during the etching process. Techniques for etching away portions of the titanium-based material layer 20 are those commonly employed in passivation etching processes.

Figure 8:
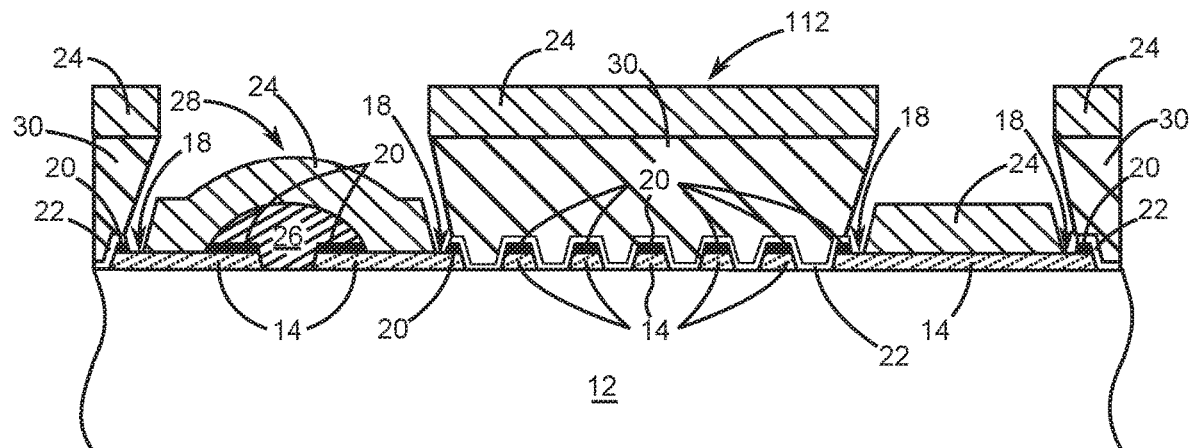
FIG. 8 is a cross-sectional view of a result of another step that involves disposing the UBM layer onto the exposed titanium-alloyed surface and the crossover pattern.

FIG. 8 is a cross-sectional view of a result of another step that involves disposing the UBM layer 24 onto the exposed titanium-alloyed surface 18 and the crossover pattern 26 (step 112). The UBM layer 24 is typically made of metals such as a titanium and aluminum or titanium and gold. Contact resistivity between the metal of the UBM layer 24 and the titanium-alloyed surface is in the range of $1 \times 10^{-8}$ and $1 \times 10^{-7}$ $\Omega/cm^2$.

Figure 9:
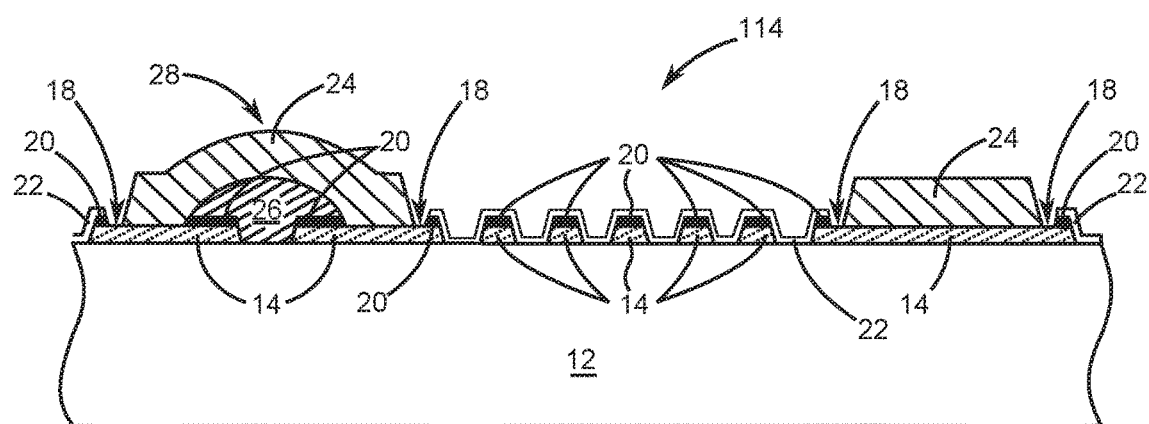
FIG. 9 is a cross-sectional view of a result of a final step that involves lifting off the photoresist mask and unwanted portions of the UBM layer.

FIG. 9 is a cross-sectional view of a result of a final step that involves lifting off the photoresist mask 30 (FIG. 6) and unwanted portions of the UBM layer 24 (step 114). At this point, the acoustic wave device 10 (FIG. 1) is complete and ready for testing. The acoustic wave device 10 typically has an absolute value of insertion loss that is no more than 2 dB. However, depending on the ultimate function of the acoustic wave device 10, whether it is employed as a filter component or a sensor component determines the boundaries of insertion loss, which can range from 0.1 dB to 10 dB.

Those skilled in the art will recognize improvements and modifications to the preferred embodiments of the present disclosure. All such improvements and modifications are considered within the scope of the concepts disclosed herein and the claims that follow.

What is claimed is:

1. A method of fabricating a device comprising:
   disposing a patterned aluminum-based material layer onto a crystalline substrate;
   disposing a titanium-based material layer over the patterned aluminum-based material layer; and
   etching away portions of the titanium-based material layer from portions of the patterned aluminum-based material layer to leave an exposed titanium-alloyed surface on the portions of the patterned aluminum-based material layer.

2. The method of fabricating the device of claim 1 wherein the patterned aluminum-based material layer forms a pair of interdigitated transducers to provide a surface wave acoustic device.

3. The method of fabricating a device of claim 2 further including disposing an under bump metallurgy layer comprising a metal directly in contact with the portions of the exposed titanium-alloyed surface.

4. The method of fabricating a device of claim 3 wherein contact resistivity between the under bump metallurgy layer metal and the exposed titanium-alloyed surface is in the range of $1 \times 10{-8}$ and $1 \times 10{-7}$ ohm/cm2.

* * * * *